(12) United States Patent
Won

(10) Patent No.: US 8,610,107 B2
(45) Date of Patent: Dec. 17, 2013

(54) LIGHT EMITTING DEVICE HAVING A WELL STRUCTURE DIFFERENT OF A MULTI-QUANTUM WELL STRUCTURES

(75) Inventor: Jong Hak Won, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 13/363,523

(22) Filed: Feb. 1, 2012

(65) Prior Publication Data

US 2012/0161102 A1  Jun. 28, 2012

(30) Foreign Application Priority Data

Jul. 11, 2011  (KR) .................. 10-2011-0068585

(51) Int. Cl.
*H01L 29/06* (2006.01)
(52) U.S. Cl.
USPC .................. 257/13; 257/E33.008; 438/20
(58) Field of Classification Search
USPC .................. 257/13, E33.008; 438/20
See application file for complete search history.

(56) References Cited

U.S. PATENT DOCUMENTS

| | | | | |
|---|---|---|---|---|
| 5,679,965 | A * | 10/1997 | Schetzina ............... | 257/103 |
| 5,687,185 | A * | 11/1997 | Kozlovsky et al. ...... | 372/43.01 |
| 2002/0053676 | A1 | 5/2002 | Kozaki ................. | 257/88 |
| 2004/0056258 | A1* | 3/2004 | Tadatomo et al. ......... | 257/79 |
| 2007/0045655 | A1* | 3/2007 | Song et al. ............. | 257/104 |
| 2007/0085097 | A1 | 4/2007 | Kim et al. .............. | 257/94 |
| 2008/0023689 | A1* | 1/2008 | Kim et al. .............. | 257/13 |
| 2009/0200565 | A1 | 8/2009 | Sakong et al. ........... | 257/94 |
| 2010/0189148 | A1 | 7/2010 | Kyono et al. ........... | 372/45.01 |
| 2011/0042721 | A1 | 2/2011 | Ahn ..................... | 257/201 |
| 2012/0153256 | A1* | 6/2012 | Won .................... | 257/13 |

FOREIGN PATENT DOCUMENTS

EP  1 248 303 A1  10/2002

OTHER PUBLICATIONS

European Search Report dated Nov. 16, 2016 issued in Application No. 12 15 6075.
European Search Report dated Nov. 16, 2016 for Application No. 12156073.
U.S. Office Action dated Mar. 27, 2013 for U.S. Appl. No. 13/363,554.

* cited by examiner

*Primary Examiner* — Jami M Valentine
(74) *Attorney, Agent, or Firm* — KED & Associates LLP

(57) ABSTRACT

A light emitting device is provided. The light emitting device comprises an active layer comprising a plurality of well layers and barrier layers. The barrier layers comprise a first barrier layer which is the nearest to a second conductive type semiconductor layer and has a first band gap, a second barrier layer having a third band gap, and a third barrier layer having the first band gap between the second barrier layer and a first conductive type semiconductor layer. The well layers comprise a first well layer having a second band gap between the first and the second barrier layers, and a second well layer between the second barrier layer and the third barrier layer. The second barrier layer is disposed between the first and the second well layers, and the third band gap is narrower than the first band gap and wider than the second band gap.

20 Claims, 6 Drawing Sheets

US 8,610,107 B2

LIGHT EMITTING DEVICE HAVING A WELL STRUCTURE DIFFERENT OF A MULTI-QUANTUM WELL STRUCTURES

CROSS-REFERENCE TO RELATED APPLICATIONS

The present application claims priority under 35 U.S.C. §119(a) of Korean Patent Application No. 10-2011-0068585 filed on Jul. 11, 2011, which is hereby incorporated by reference in its entirety.

BACKGROUND

Embodiments relate to a light emitting device, a method for fabricating the same, and a light emitting device package.

Light emitting diodes (LEDs) are light emitting devices that convert an electric current into light. In recent, as the brightness of LEDs is gradually improved, the LEDs are being widely used for light sources of display devices, automobiles, and lightings.

A high-power light emitting chip which generates short wavelength light such as blue light or green light to realize full color has been developed in recent years. Thus, a phosphor which absorbs a portion of light emitted from a light emitting chip to emit light having a wavelength different from that of the absorbed light may be coated on the light emitting chip to combine LEDs having various colors with each other and also to realize an LED emitting white light.

SUMMARY

Embodiment provides a light emitting device in which a second barrier layer disposed between well layers adjacent to a second conductive type semiconductor layer has a band gap narrower than that of the other barrier layer in an active layer.

Embodiment provides a light emitting device in which a second barrier layer disposed between well layers adjacent to a second conductive type semiconductor layer has a band gap and thickness less than those of the other barrier layer.

In one embodiment, a light emitting device comprises: a first conductive type semiconductor layer; a second conductive type semiconductor layer on the first conductive type semiconductor layer; and an active layer between the first conductive type semiconductor layer and the second conductive type semiconductor layer, the active layer comprising a plurality of well layers and a plurality of barrier layers, wherein the plurality of barrier layers comprise: a first barrier layer which is the nearest to the second conductive type semiconductor layer, the first barrier layer having a first band gap; a second barrier layer adjacent to the first barrier, the second barrier layer having a third band gap; and at least one third barrier layer having the first band gap between the second barrier layer and the first conductive type semiconductor layer, the plurality of well layers comprise: a first well layer between the first barrier layer and the second barrier layer, the first well layer having a second band gap; and a second well layer between the second barrier layer and the at least one third barrier layer, the second barrier layer is disposed between the first well layer and the second well layer, and the third band gap is narrower than the first band gap and wider than the second band gap.

In another embodiment, a light emitting device comprises: a first conductive type semiconductor layer; a second conductive type semiconductor layer; and an active layer between the first conductive type semiconductor layer and the second conductive type semiconductor layer, the active layer comprising a plurality of well layers and a plurality of barrier layers, wherein the plurality of barrier layers comprise: a first barrier layer which is the nearest to the second conductive type semiconductor layer, the first barrier layer having a first band gap; a second barrier layer adjacent to the first barrier, the second barrier layer having a third band gap; and at least one third barrier layer having the first band gap between the second barrier layer and the first conductive type semiconductor layer, the plurality of well layers comprise: a first well layer between the first barrier layer and the second barrier layer; and a second well layer between the second barrier layer and the at least one third barrier layer, the plurality of well layers have the same thickness and second band gap as each other, the second barrier layer is disposed between the first well layer and the second well layer, and the third band gap is narrower than the first band gap and wider than the second band gap.

In further another embodiment, a light emitting device comprises: a first conductive type semiconductor layer comprising a nitride semiconductor layer; a second conductive type semiconductor layer comprising a nitride semiconductor layer; and an active layer between the first conductive type semiconductor layer and the second conductive type semiconductor layer, the active layer comprising a plurality of barrier layers and a plurality of well layers which are alternately disposed, wherein the plurality of well layers comprise: a first well layer which is the nearest to the second conductive type semiconductor layer; and a second well layer which is the nearest to the first well layer, each of the first and second well layers has a second band gap; the plurality of barrier layers comprise: a plurality of first barrier layers, each having a first band gap; and one second barrier layer having a third band gap, the second barrier layer is disposed between the first well layer and the second well layer, and the third band gap ranges from the first band gap to the second band gap.

The details of one or more embodiments are set forth in the accompanying drawings and the description below. Other features will be apparent from the description and drawings, and from the claims.

DETAILED DESCRIPTION OF THE EMBODIMENTS

Figure 1:
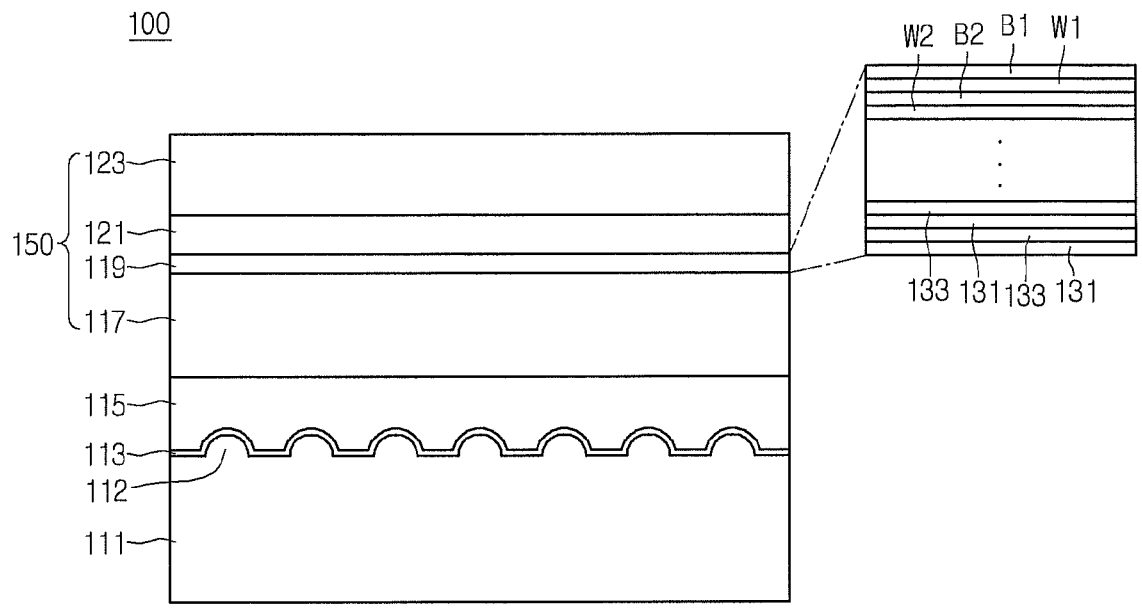
FIG. 1 is a side sectional view of a light emitting device according to a first embodiment.

Hereinafter, a light emitting device and a method for fabricating the same according to embodiments will be described with reference to the accompanying drawings. In the description of embodiments, it will be understood that when a layer (or film), region, pattern or structure is referred to as being 'on' or 'under' another layer (or film), region, pattern or structure, the terminology of 'on' and 'under' includes both the meanings of 'directly' and 'indirectly'. Further, the reference about 'on/over' and 'under' each layer will be made on the basis of drawings. In the drawings, the thickness or size of each layer is exaggerated, omitted, or schematically illustrated for convenience in description and clarity. Also, the size of each element does not entirely reflect an actual size.

FIG. 1 is a side sectional view of a light emitting device according to a first embodiment.

Referring to FIG. 1, a light emitting device 100 may includes a substrate 111, a buffer layer 113, a low conductive layer 115, a first conductive type semiconductor layer 117, an active layer 119, a second clad layer 121, and a second conductive type semiconductor layer 123.

The material of the substrate 111 may includes a semiconductor material, a metal material, a composite material, or the combination of. The substrate 111 may include a transmitting, insulating, or conductive substrate. For example, the substrate 111 may be formed of at least one of sapphire ($Al_2O_3$), SiC, Si, GaAs, GaN, ZnO, Si, GaP, InP, Ge, $Ga_2O_3$, and $LiGaO_3$. A plurality of protrusions 112 may be disposed on a top surface of the substrate 111. The plurality of protrusions 112 may be manufactured by etching the substrate 111. Alternatively, the plurality of protrusions 112 may have a light extraction structure formed of a separate compound such as a roughness. Each of the protrusions 112 may have a stripe shape, a hemisphere shape, or a dome shape. The substrate 111 may have a thickness of about 30 μm to about 150 μm, but is not limited thereto. The substrate 111 may be removed after a semiconductor layer is grown.

A plurality of compound semiconductor layers may be grown on the substrate 111. Equipment for growing the plurality of compound semiconductor layers on the substrate 111 may include an electron beam evaporator, a physical vapor deposition (PVD) device, a chemical vapor deposition (CVD) device, a plasma laser deposition (PLD) device, a dual-type thermal evaporator, a sputtering device, a metal organic chemical vapor deposition (MOCVD) device, and the like, but is not limed thereto.

The buffer layer 113 may be disposed on the substrate 111. The buffer layer 113 may be formed as at least one layer using a group II to VI compound semiconductor. The buffer layer 113 may include a semiconductor layer using a group III-V compound semiconductor. For example, the buffer layer 113 is formed of a semiconductor having a compositional formula of $In_xAl_yGa_{1-x-y}N$ ($0 \leq x \leq 1$, $0 \leq y \leq 1$, $0 \leq x+y \leq 1$), i.e., at least one of compound semiconductors such as GaN, InN, AlN, InGaN, AlGaN, InAlGaN, and AlInN. The buffer layer 113 may have a super lattice structure in which semiconductor layers different from each other are alternately disposed.

The buffer layer 113 may reduce a lattice constant difference between the substrate 111 and a nitride-based semiconductor layer. Also, the buffer layer 113 may be defined as a defect control layer. The buffer layer 113 may have a lattice constant between a lattice constant of the substrate 111 and a lattice constant of the nitride-base semiconductor layer. For example, the buffer layer 113 may be formed of an oxide such as ZnO. The buffer layer 113 may have a thickness of about 30 nm to about 500 nm, but is not limited thereto. The buffer layer 113 may be omitted.

The low conductive layer 115 is disposed on the buffer layer 113. Also, the low conductive layer 115 may be formed of a material having conductivity lower than that of the first conductive type semiconductor layer 117. For example, the low conductive layer 115 may be formed of a GaN-based semiconductor using a group III-V compound semiconductor. The low conductive layer 115 may be formed as an undoped semiconductor layer. The undoped semiconductor layer may have a first conductive type property even though the undoped semiconductor layer is not doped with a conductive dopant. The undoped semiconductor layer may be omitted, but is not limited thereto. For another example, the low conductor layer 115 may be disposed between the plurality of first conductive type semiconductor layers 117.

The first conductive type semiconductor layer 117 may be disposed on at least one layer of the substrate 111, the buffer layer 113, and the low conductive layer 115. The first conductive type semiconductor layer 117 may be formed of a semiconductor compound. Also, the first conductive type semiconductor layer 117 may be formed of a compound semiconductor such as a group III-V compound semiconductor or a group II-VI compound semiconductor. The first conductive type semiconductor layer 117 may be doped with a first conductive dopant. For example, the first conductive type semiconductor layer 117 may include a nitride semiconductor layer having a compositional formula of $In_xAl_yGa_{1-x-y}N$ ($0 \leq x \leq 1$, $0 \leq y \leq 1$, $0 \leq x+y \leq 1$). The first conductive type semiconductor layer 117 may be doped with the first conductive dopant. When the first conductive type semiconductor layer 117 is an n-type semiconductor layer, the first conductive dopant may include Si, Ge, Sn, Se, or Te as an n-type dopant.

A super lattice structure in which first and second semiconductor layers different from each other are alternately disposed may be disposed on at least one layer of the low conductive layer 115 and the first conductive type semiconductor layer 117. Each of the first and second semiconductor layers 117 and 123 may have a thickness of about several □ or more.

The first clad layer (not shown) may be disposed between the first conductive type semiconductor layer 117 and the active layer 119. For example, the first clad layer may be formed of a GaN-based semiconductor. Also, the first clad layer may restrict carriers. For another example, the first clad layer may include an InGaN layer or an InGaN/GaN super lattice structure, but is not limited thereto. The first clad layer may be doped with an n-type and/or p-type dopant or formed of an undoped semiconductor. For example, the first clad layer may be realized as an n-type semiconductor layer or a low conductive layer.

The active layer 119 is disposed on the first conductive type semiconductor layer 117. The active layer 119 may have at least one of a single well structure, a single quantum well structure, a multi well structure, a multi quantum well (MQW) structure, a quantum wire structure, and a quantum dot structure. The active layer 119 may include a well layer 131 and a barrier layer 133 which are alternately disposed. The well layer 131 may be defined as a quantum well layer, and the barrier layer 133 may be defined as a quantum barrier layer. A pair of well layer 131 and barrier layer 133 may be formed at about 2 periods to about 30 periods. For example, the well layer 131 may be formed of a semiconductor material having a compositional formula of $In_xAl_yGa_{1-x-y}N$ ($0 \leq x \leq 1$, $0 \leq y \leq 1$, $0 \leq x+y \leq 1$). The barrier layer 133 may be a semiconductor layer having a band gap wider than that of the well layer 131. For example, the barrier layer 133 may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the pair of well layer 131 and barrier layer 133 may be formed of at least one of InGaN/GaN, GaN/AlGaN, InGaN/AlGaN, InGaN/InGaN, and InAlGaN/InAlGaN.

The well layer 131 may have a thickness of about 1.5 nm to about 5 nm. For example, the well layer 131 may have a thickness of about 2 nm to about 4 nm. The barrier layer 133 may have a thickness thicker than that of the well layer 131. For example, the barrier layer 133 may have a thickness of about 5 nm to about 7 nm. At least one layer of the barrier layers 133 may be doped with at least one of the n-type dopant and the p-type dopant, but is not limited thereto.

The second clad layer 121 is disposed on the active layer 119. The second clad layer 121 may have a band gap wider than that of the barrier layer 133. The second clad layer 121 may be formed of a group III-V compound semiconductor, for example, a GaN-base semiconductor. For example, the second clad layer 121 may be formed of GaN, AlGaN, or InAlGaN, or may have a super lattice structure. Also, the conductive clad layer may be doped with the n-type or p-type dopant.

A second conductive type semiconductor layer 123 is disposed on the second clad layer 121. The second conductive type semiconductor layer 123 may be formed of a semiconductor compound. For example, the second conductive type semiconductor layer 123 may be formed of a group III-V or II-VI compound semiconductor. Also, the second conductive type semiconductor layer 123 may be doped with the first conductive dopant. For example, the second conductive type semiconductor layer 123 may be formed of one of compound semiconductors such as GaN, InN, MN, InGaN, AlGaN, InAlGaN, and AlInN. The second conductive type semiconductor layer 123 may be doped with a second conductive dopant. When the second conductive type semiconductor layer 123 is the p-type semiconductor layer, the second conductive dopant may include Mg, Zn, Ca, Sr, and Ba as the p-type dopant.

The conductive types of the semiconductor layers of a light emitting structure 150 may be reversely provided. For example, each of the second conductive type semiconductor layers 121 and 123 may be realized as the n-type semiconductor layer, and the first conductive type semiconductor layer 117 may be realized as the p-type semiconductor layer. Also, an n-type semiconductor layer that is a third conductive type semiconductor layer having a polarity opposite to that of the second conductive type semiconductor layer may be further disposed on the second conductive type semiconductor layer 123. In the light emitting device 100, the first conductive type semiconductor layer 117, the active layer 119, and the second conductive type semiconductor layer 123 may be defined as the light emitting structure 150. The light emitting structure 150 may have at least one structure of an n-p junction structure, a p-n junction structure, an n-p-n junction structure, a p-n-p junction structure. An active layer may be disposed between two layers having the n-p or p-n junction structure. Also, at least one active layer may be disposed between three layers having the n-p-n or p-n-p junction structure.

The compound semiconductor layers 113 to 123 may be grown on the substrate 111 using following growth equipment. For example, the growth equipment may include the electron beam evaporator, the physical vapor deposition (PVD) device, the chemical vapor deposition (CVD) device, the plasma laser deposition (PLD) device, the dual-type thermal evaporator, a sputtering device, the metal organic chemical vapor deposition (MOCVD) device, and the like, but is not limed thereto.

In a growth method of the active layer 119, for example, $NH_3$, TMGa(or TEGa), TMIn, TMAl may be selectively supplied as sources using $H_2$ or/and $N_2$ as a carrier gas under a predetermined growth temperature (e.g., about 700☐ to about 950☐) to form the well layer 131 formed of GaN or InGaN and the barrier layer 133 formed of GaN, AlGaN, InGaN, or InAlGaN. The growth temperature may be increased while the last quantum well structure is grown to grow the second clad layer 121. Here, when the growth temperature is further increased, thin film prosperities of the last quantum well structure may be improved.

In the active layer 119 according to the current embodiment, the plurality of well layers 131 and the plurality of barrier layers 133 are alternately stacked. Each of the plurality of well layers 131 may have an In composition ratio of about 10% to about 13%. When light emitted from the active layer 119 has a peak wavelength of about 450 nm, the well layer 131 may have a band gap of about 2.75 eV. Also, when the light emitted from the active layer 119 has a peak wavelength of about 420 nm, the well layer 131 may have a band gap of about 2.95 eV. The well layer 131 may emit light having a predetermined peak wavelength within a range from an ultraviolet band to a visible light band. The well layer 131 may have a band gap changed according to the peak wavelength.

The barrier layer 133 may be formed of a nitride semiconductor having a band gap wider than that of the well layer 131. The well layer 131 includes a first well layer W1 and a second well layer W2. The barrier layer 133 includes a first barrier layer B1 and a second barrier layer B2.

Hereinafter, for convenience of description, two quantum well structures which are the nearest to the second clad layer 121 or the second conductive type semiconductor layer 123 may be defined as a first pair structure of the first barrier layer B1 and the first well layer W1 and a second pair structure of the second barrier layer B2 and the second well layer W2 which are adjacent to the first pair structure. The first barrier layer B1 is disposed between the second clad layer 121 and the first well layer W1, and the second barrier layer B2 is disposed between the first well layer W1 and the second well layer W2. The second well layer W2 is disposed more close to the first conductive type semiconductor layer 117 than the first well layer W1. Also, the second barrier layer B2 is disposed more close to the first conductive type semiconductor layer 117 than the first barrier layer B1.

The first well layer W1 of the plurality of well layers 131 which is the nearest to the second conductive type semiconductor layer 123 may be doped with the p-type dopant having a relatively large particle size. Thus, the first well layer W1 may be deteriorated in crystalline quality. Thus, the second well layer W2 may have a crystalline superior than that of the first well layer W1. In the current embodiment, the carriers injected through the second conductive type semiconductor layer 123 may be further moved into the second well layer W2 adjacent to the first well layer W1. Thus, the injection efficiency of the carrier into the second well layer W2 may be improved, and thus recombination of the carriers may be more increased.

Here, the carriers may be holes. The holes may have an injection length and mobility less by several times to several hundred times than those of electrons. Thus, the amount of holes may be significantly reduced and also recombination of the holes efficiency may be reduced in a specific region of the active layer 119. However, in the current embodiment, since the injection efficiency of the holes into the second well layer W2 is increased by the second barrier layer B2, the recombination within the second well layer W2 may be improved.

For example, the two well layers W1 and W2 adjacent to the second clad layer 121 may serve as main light emitting layers. That is, the two well layers W1 and W2 may emit light of about 80% or more of light emitted from the multi quantum well structure. In the current embodiment, the second barrier layer B2 adjacent to the first and second well layers W1 and W2 may be improved in structure to further move the holes injected from the second clad layer 121 into the second well layer W2.

The second barrier layer B2 may have a band gap or thickness less than those of other barrier layers 133 and B1. Thus, the carriers injected from the second clad layer 121 into the active layer 119, i.e., holes may be further injected into the second well layer W2 adjacent to the first well layer W1. The second barrier layer B2 may be defined as a hole guide barrier layer. Also, the second clad layer 121 is formed at a relatively low temperature when compared to that of the active layer 119. Thus, the crystalline of the first well layer W1 may be deteriorated by a change of the temperature. The second well layer W2 may be further spaced from the second clad layer 121 than the first well layer W1. Thus, the second well layer W2 may have relatively superior crystalline. As the recombination within the second well layer W2 is increased, the whole intensity of light may be improved.

Also, the second barrier layer B2 is disposed more close to the second conductive type semiconductor layer 123 than the first conductive type semiconductor layer 117 or the first barrier layer B1 is disposed more close to a central portion of the active layer 119 to improve the recombination within the second well layer W2.

Figure 2:
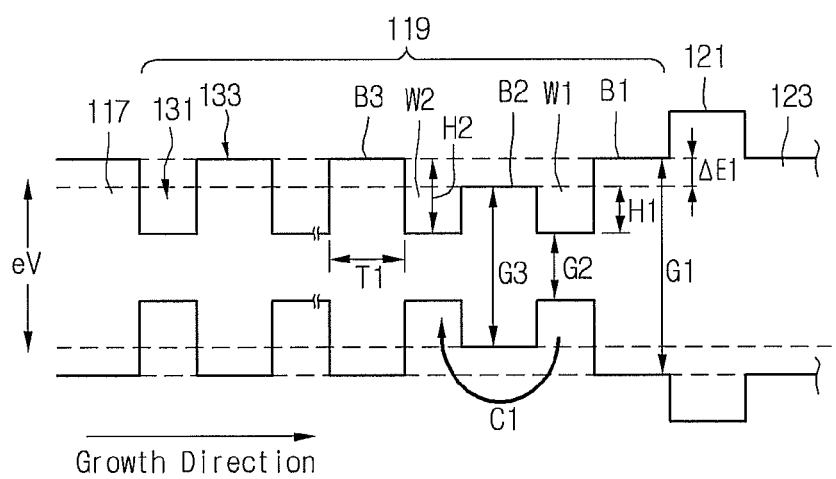
FIG. 2 is a diagram illustrating an energy band of an active layer of FIG. 1.

FIG. 2 is a diagram illustrating an energy band of the active layer of FIG. 1. In FIG. 2, a vertical axis represents an absolute size (eV) of an energy band gap, and a horizontal axis represents a growth direction.

Referring to FIG. 2, the well layer 131 and the barrier layer 133 are alternately disposed within the active layer 119. In the barrier layer 133, a first barrier layer B1, a second barrier layer B2, and a third barrier layer B3 are disposed in order adjacent to the second clad layer 121, i.e., are successively disposed. Also, the first well layer W1 is disposed between the first barrier layer B1 and the second barrier layer B2. Also, the second well layer W2 is disposed between the second barrier layer B2 and the third barrier layer B3.

The pair structure of the first barrier layer B1 and the first well layer W1 may be equal to or different from that of the second barrier layer B2 and the second well layer W2. For example, the first barrier layer B1 may be formed of InGaN, AlGaN, AlInGaN, or GaN. Also, for example, the second barrier layer B2 may be the same semiconductor layer or a semiconductor layer different from the first barrier layer B1 among semiconductor layers formed of InGaN, AlGaN, AlInGaN, and GaN.

For another example, when the first barrier layer B1 is an InGaN-based semiconductor layer, the second barrier layer B2 may be an InGaN-based semiconductor layer which has an In content greater than that of the first barrier layer B1 and less than that of the first well layer W1. Each of the first and second well layers W1 and W2 may have an In composition ratio of about 10% to about 13%. The second barrier layer B2 may have an In composition ratio of about 3% to about 5%, and the first barrier layer B1 may have an In composition ration of about 0% to about 2%. For example, the plurality of well layers 131 may be formed of an InGaN-based semiconductor. The plurality of barrier layers 133 may be formed of a semiconductor having a compositional formula of $In_xAl_yGa_{1-x-y}N$ ($0 \leq x \leq 1$, $0 \leq y \leq 1$, $0 \leq x+y \leq 1$). The plurality of barrier layers 133 may be formed of a semiconductor having a compositional formula of $In_xAl_yGa_{1-x-y}N$ ($0 \leq x \leq 1$, $0 \leq y \leq 1$, $0 \leq x+y \leq 1$). The second barrier layer B2 may be formed of a semiconductor having a compositional formula of $In_xGa_{1-x}N$ ($0.03 < x < 0.05$).

For another example, when the first barrier layer B1 is an AlGaN-based semiconductor, the second barrier layer B2 may be an AlGaN-based semiconductor layer which has an Al content t less than that of the first barrier layer B1.

The second barrier layer B2 may have a third band gap G3 narrower than a first band gap G1 of each of other barrier layers 133, B1, and B3 and wider than a second band gap G2 of each of the first and second well layers W1 and W2. The third band gap G3 of the second barrier layer B2 may range of 2.75 eV < G3 < 3.42 eV. For example, the second barrier layer B2 may have a third band gap G3 of a value approaching about 3.42 eV than about 2.75 eV. That is, the third band gap G3 of the second barrier layer B2 may range from about 3 eV to about 3.3 eV.

The second band gap G2 of each of the first and second well layers W1 and W2 may be equal to that of the other well layer 131. The first band gap G1 of each of the first and second barrier layers B1 and B2 may be equal to that of the other barrier layer 133.

The first to third barrier layers B1, B2, and B3 may have the same thickness T1. For example, each of the first to third barrier layers B1, B2, and B3 may have a thickness of about 5 nm to 7 nm. The barrier layers 131 of the active layer 119 may have the same thickness T1.

The thickness T1 of each of the first to third barrier layers B1, B2, and B3 may be at least thicker than that of each of the first and second well layers W1 and W2. For example, each of the first and third barrier layers B1, B2, and B3 may have a thickness T1 thicker by about 2 nm to about 3 nm than that of each of the first and second well layers W1 and W2. The second barrier layer B2 of the first to third barrier layers B1, B2, and B3 may have the same thickness as at least one thickness T1 of the first and second well layers W1 and W2, but is not limited thereto.

The second barrier layer B2 may have a barrier height H1 less than that H2 of each of the first and third barrier layers B1 and B3. For example, the second barrier layer B2 may have the barrier height H1 greater than about 50% of the height H2 of each of the first and third barrier layers B1 and B3.

A band gap difference $\Delta E1$ between the second barrier layer B2 and the first barrier layer B1 may above about 0.01 eV, e.g., be obtained by following Equation: $\Delta E1 = G1 - G3$. Here, the reference symbol $\Delta E1$ may be a band gap difference within a conduction band or a valence electron band. An actual band gap difference may be about $2\square E1$, i.e., about 0.02 eV or more.

Thus, a portion C1 of the holes injected into the first well layer W1 may be easily moved into the second well layer W2 by the height H1 of the second barrier layer B2 and the band gap difference $\Delta E1$ between the first barrier layer B1 and the second barrier layer B2. Therefore, the recombination within the second well layer W2 may be increased. In the current embodiment, a more amount of light may be emitted from the second well layer W2.

Also, since each of elements of the first well layer W1 may have the same composition ratio and thickness as those of each of elements of the second well layer W2, it may prevent a width of the light emitting spectrum from being increased. Thus, it may prevent a degree of color purity from being decreased.

Figure 3:
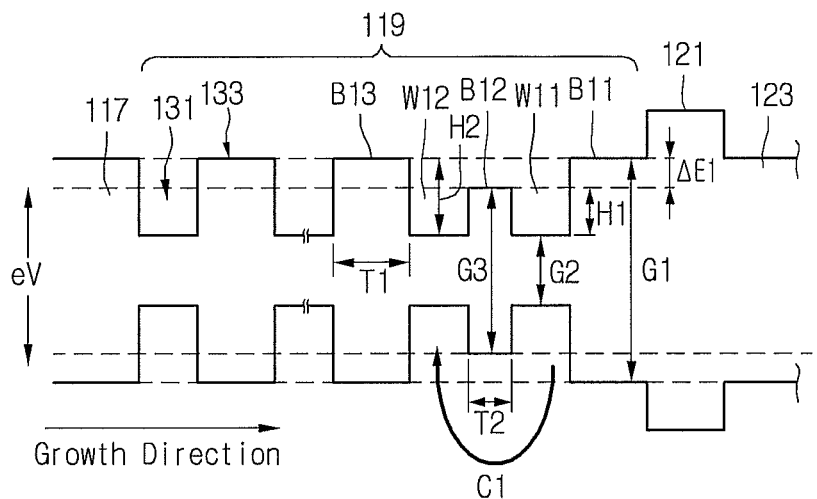
FIG. 3 is a diagram illustrating an energy band of an active layer in a light emitting device according to a second embodiment.

FIG. 3 is a diagram illustrating an energy band of an active layer according to a second embodiment.

Referring to FIG. 3, a well layer 131 and a barrier layer 133 are alternately disposed within an active layer 119. In the barrier layer 133, a first barrier layer B11, a second barrier layer B12, and a third barrier layer B13 are disposed in order adjacent to a second clad layer 121, i.e., are successively disposed. Also, a first well layer W11 is disposed between the first barrier layer B11 and the second barrier layer B12. Also, a second well layer W12 is disposed between the second barrier layer B12 and the third barrier layer B13.

A pair structure of the first barrier layer B11 and the first well layer W11 may be equal to or different from that of the second barrier layer B12 and the second well layer W12. For example, the first barrier layer B11 may be formed of InGaN, AlGaN, AlInGaN, or GaN. Also, for example, the second barrier layer B12 may be the same semiconductor layer or a semiconductor layer different from the first barrier layer B11 among semiconductor layers formed of InGaN, AlGaN, AlInGaN, and GaN.

For another example, when the first barrier layer B11 is an InGaN-based semiconductor layer, the second barrier layer B12 may be an InGaN-based semiconductor layer which has an In content greater than that of the first barrier layer B11 and less than that of the first well layer W11. Each of the first and second well layers W11 and W12 may have an In composition ratio of about 10% to about 13%. Also, the second barrier layer B12 may have an In composition ratio of about 3% to about 5%, and the first barrier layer B11 may have an In composition ratio of about 0% to about 2%. The plurality of well layers 131 may be formed of an InGaN-based semiconductor. The plurality of barrier layers 133 may be formed of a semiconductor having a compositional formula of $In_xAl_yGa_{1-x-y}N$ ($0 \leq x \leq 1$, $0 \leq y \leq 1$, $0 \leq x+y \leq 1$). The plurality of barrier layers 133 may be formed of a semiconductor having a compositional formula of $In_xAl_yGa_{1-x-y}N$ ($0 \leq x \leq 1$, $0 \leq y \leq 1$, $0 \leq x+y \leq 1$). The second barrier layer B12 may be formed of a semiconductor having a compositional formula of $In_xGa_{1-x}N$ ($0.03 < x < 0.05$).

For another example, when the first barrier layer B11 is an AlGaN-based semiconductor, the second barrier layer B12 may be an AlGaN-based semiconductor layer which has an Al content t less than that of the first barrier layer B11.

The second barrier layer B12 may have a third band gap G3 narrower than a first band gap G1 of each of other barrier layers 133, B11, and B13 and wider than a second band gap G2 of each of the first and second well layers W11 and W12. The third band gap G3 of the second barrier layer B12 may range of 2.75 eV<G3<3.42 eV. For example, the second barrier layer B12 may have a third band gap G3 of a value approaching about 3.42 eV than about 2.75 eV. That is, the third band gap G3 of the second barrier layer B12 may range from about 3 eV to about 3.3 eV.

The second band gap G2 of each of the first and second well layers W11 and W12 may be equal to that of the other well layer 131. The first band gap G1 of each of the first and second barrier layers B11 and B12 may be equal to that of the other barrier layer 133.

The second barrier layer B12 may have a thickness T2 different from a thickness T1 of each of other barrier layers 133, B11, and B13. For example, the second barrier layer B12 may have a thickness T2 thinner than that T1 of each of the first and third barrier layers B11 and B13, i.e., a thickness T1 of about 3 nm to about 4 nm. Also, the second barrier layer B12 may have a thickness T2 at least thicker than that of each of the first and second well layers W11 and W12. For example, the second barrier layer B12 may have a thickness thicker by about 0.1 nm to about 1 nm than that of each of the first and second well layers W11 and W12. Also, the second barrier layer B12 may have a thickness at which electron tunneling does not occur between the first and second well layers W11 and W12. When the electron tunneling occurs, the first and second well layers W11 and W12 may serve as a single well layer to generate noises in the light emitting wavelength.

The second barrier layer B12 may have a barrier height H1 less than that H2 of each of the first and third barrier layers B11 and B13. Also, when the second barrier layer B12 has the barrier height H1 less than about 50% of the height H2 of each of the first and third barrier layers B11 and B13, a role serving as a carrier barrier may be slight. Thus, the barrier height H1 may be greater than about 50% of the barrier height H2.

A band gap difference $\Delta E1$ between the second barrier layer B12 and the first barrier layer B11 may above about 0.01 eV, e.g., be obtained by following Equation: $\Delta E1 = G1 - G3$. Thus, a portion C1 of the holes injected into the first well layer W11 may be easily moved into the second well layer W12 by the barrier height H1 of the second barrier layer B12 and the band gap difference $\Delta E1$ between the first barrier layer B11 and the second barrier layer B12. Therefore, recombination within the second well layer W12 may be increased. In the current embodiment, a more amount of light may be emitted from the second well layer W12.

Also, since each of elements of the first well layer W11 may have the same composition ratio and thickness as those of each of elements of the second well layer W12, it may prevent a width of the light emitting spectrum from being increased. Thus, it may prevent a degree of color purity from being decreased. Also, the second barrier layer B12 may be doped with an n-type dopant, but is not limited thereto.

Figure 4:
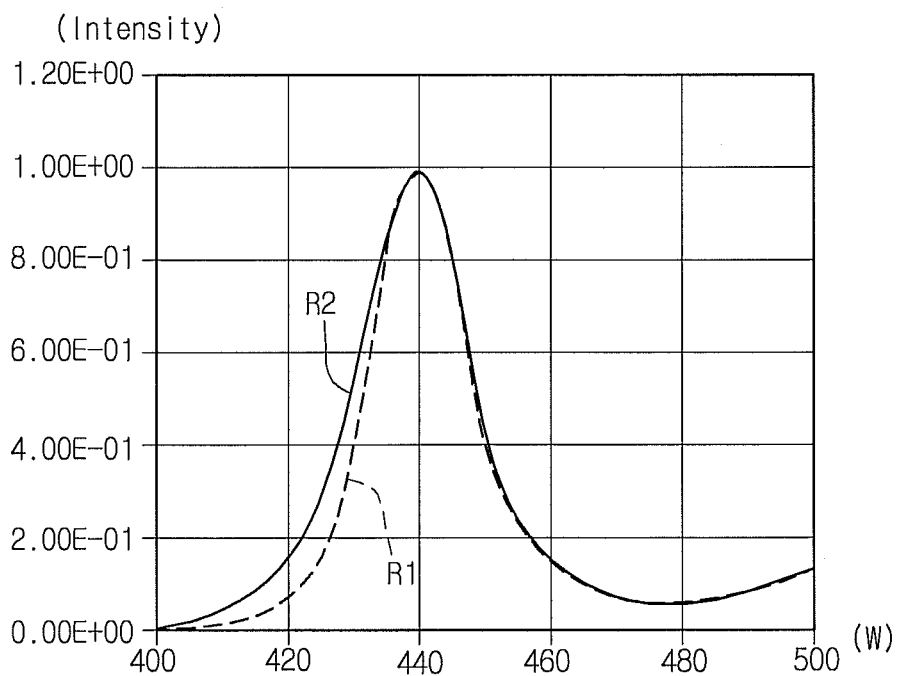
FIG. 4 is a graph illustrating wavelength spectrums of light emitting devices according to a comparison example and an embodiment.

FIG. 4 is a graph illustrating a wavelength spectrum of light emitted from an active layer according to an embodiment.

Referring to FIG. 4, barrier layers of an active layer of a comparison example R1 may have the same band gap and thickness. An active layer according to an embodiment R2 may have an optical output greater by about 3% or more than that of the active layer of the comparison example R1.

Figure 5:
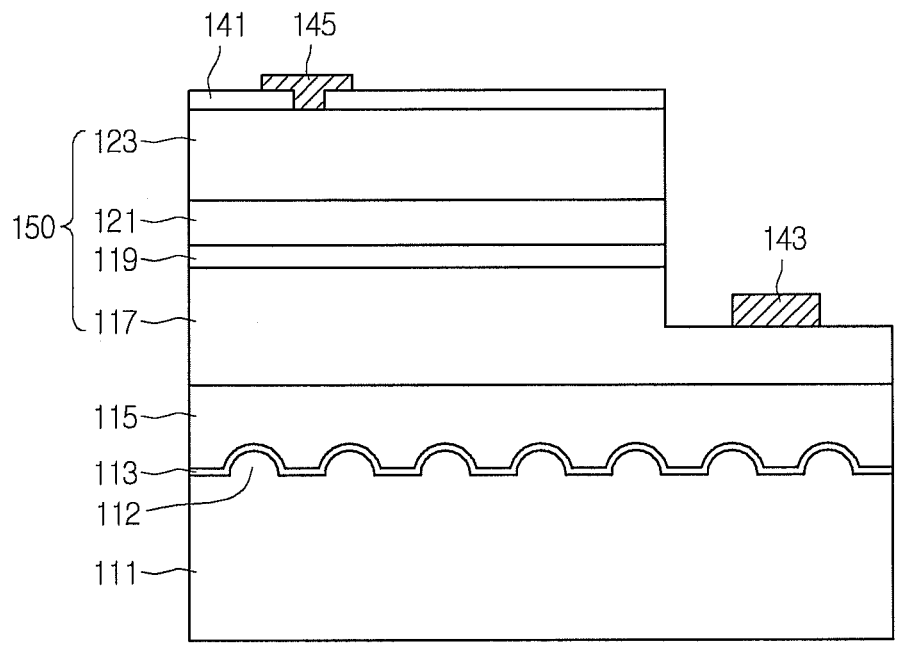
FIG. 5 is a view illustrating another example of the light emitting device of FIG. 1.

FIG. 5 is a view illustrating another example of the light emitting device of FIG. 1.

Referring to FIG. 5, in a light emitting device 101, an electrode layer 141 and a second electrode 145 are disposed on a light emitting structure 150. Also, a first electrode 143 is disposed on a first conductive type semiconductor layer 117.

The electrode layer 141 may serve as a current spreading layer. The electrode layer 141 may be formed of a material having transmitting and conductive properties. The electrode layer 141 may have a reflective index less than that of a compound semiconductor layer.

The electrode layer 141 is disposed on a top surface of a second conductive type semiconductor layer 123. The electrode layer 141 may include a transmitting electrode layer or a metal oxide layer. For example, the electrode layer 141 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, $IrO_x$, $RuO_x$, and NiO. Here, the electrode layer 141 may be formed as at least one layer. The electrode layer 141 may include a metal layer or a reflective electrode layer. For example, the electrode layer 141 may be formed of one of Al, Ag, Pd, Rh, Pt, Ir and alloys of two or more thereof.

The second electrode 145 may be disposed on the second conductive type semiconductor layer 123 and/or the electrode layer 141. Also, the second electrode 145 may include an electrode pad. For example, the second electrode 145 may further include a current spreading pattern having an arm structure or a finger structure. The second electrode 145 may be formed of a metal having properties serving as an ohmic contact layer, an adhesion layer, and a bonding layer and have a non-transmitting property, but are not limited thereto.

The first electrode 143 is disposed on a portion of the first conductive type semiconductor layer 117. For example, each of the first electrode 143 and the second electrode 145 may be formed of one of Ti, Ru, Rh, Ir, Mg, Zn, Al, In, Ta, Pd, Co, Ni, Si, Ge, Ag, Au, and alloys thereof.

An insulation layer may be further disposed on the light emitting device 101. The insulation layer may prevent the layers of the light emitting structure 145 from being short-circuited with each other and prevent moisture from being permeated.

Figure 6:
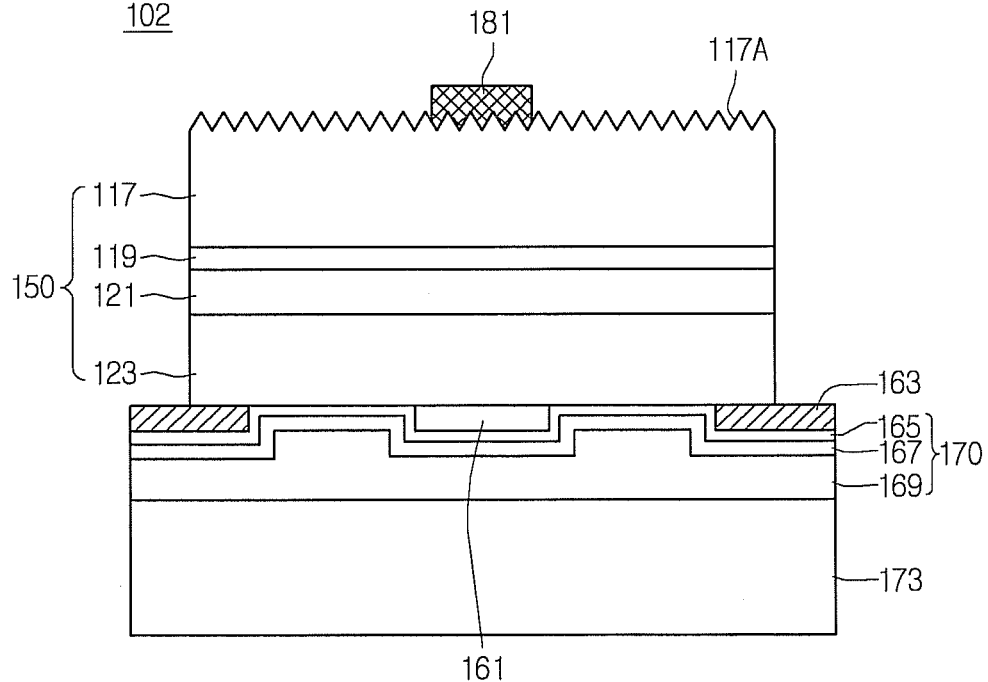
FIG. 6 is a view illustrating another example of the light emitting device of FIG. 1.

FIG. 6 is a view illustrating another example of the light emitting device of FIG. 1.

Referring to FIG. 6, a current blocking layer 161, channel layers 163, and a second electrode 170 are disposed under a light emitting structure 150. For example, the current blocking layer 161 may be formed of at least one of $SiO_2$, $SiO_x$, $SiO_xN_y$, $Si_3N_4$, $Al_2O_3$, and $TiO_2$. At least one current blocking layer 161 may be disposed between the channel layers 163.

The current blocking layer 161 may be disposed to correspond to the first electrode 181 disposed on the light emitting structure 150 in a thickness direction of the light emitting structure 150. The current blocking layer 161 may intercept a current supplied from the second electrode 170 to spread the current into the other path.

Each of the channel layers 163 may be disposed along an edge of a bottom surface of the second conductive type semiconductor layer 123. The channel layer 163 may have a ring shape, a roof shape, a loop shape, or a frame shape. The channel layer 163 may be formed of at least one of an insulation material, a transmitting material, and a conductive material. For example, the channel layer 163 may be formed of at least one of ITO, IZO, IZTO, IAZO, IGZO, IGTO, AZO, ATO, $SiO_2$, $SiO_x$, $SiO_xN_y$, $Si_3N_4$, $Al_2O_3$, $TiO_2$. An inner part of the channel layer 163 is disposed under the second conductive type semiconductor layer 123, and an outer part of the channel layer 163 is disposed outside a side surface of the light emitting structure 150. The channel layer 163 may be defined as a protection layer for protecting the side surface of the light emitting structure 150 from the second electrode 170.

The second electrode 170 may be disposed under the second conductive type semiconductor layer 123. The second electrode 170 may include a plurality of conductive layers 165, 167, and 169.

The second electrode 170 includes an ohmic contact layer 165, a reflective layer 167, and a bonding layer 169. The ohmic contact layer 165 includes a transmitting conductive layer or a metal. For example, the ohmic contact layer 165 may be formed of a low conductive material such as ITO, IZO, IZTO, IAZO, IGZO, IGTO, AZO, and ATO or a metal such as Ni and Ag. The reflective layer 167 is disposed under the ohmic contact layer 165. For example, the reflective layer 167 may have a structure including at least one layer foamed of Ag, Ni, Al, Rh, Pd, Ir, Ru, Mg, Zn, Pt, Au, Hf and combinations thereof. The reflective layer 167 may contact a lower portion of the second conductive type semiconductor layer 123. The reflective layer 167 may ohmic-contact the second conductive type semiconductor layer 123 using a metal or a low conductive material such as ITO, but is not limited thereto.

The bonding layer 169 is disposed under the reflective layer 167. The bonding layer 169 may be used as a barrier metal or a bonding metal. For example, the bonding layer 169 may be formed of at least one of Ti, Au, Sn, Ni, Cr, Ga, In, Bi, Cu, Ag, Ta, and alloys thereof.

A support member 173 may be disposed under the bonding layer 169. The support member 173 may include a conductive member. For example, the support member 174 may be formed of a conductive material such as copper (Cu), gold (Au), nickel (Ni), molybdenum (Mo), copper-tungsten (Cu—W), and carrier wafers (e.g., Si, Ge, GaAs, ZnO, Sic, etc). For another example, the support member 173 may be realized as a conductive sheet.

Here, the substrate of FIG. 1 may be removed. A method for removing the growth substrate may include a physical method (e.g., laser lift off) or/and a chemical method (e.g., wet-etching). Thus, the first conductive type semiconductor layer 117 may be exposed. An isolation etching process may be performed in a direction in which the substrate is removed to form the first electrode 181 on the first conductive type semiconductor layer 117.

A light extraction structure 117A such as a roughness may be disposed on a top surface of the first conductive type semiconductor layer 117. The outer part of the channel layer 163 may be exposed outside a sidewall of the light emitting structure 150. The inner part of the channel layer 163 may contact a bottom surface of the second conductive type semiconductor layer 123.

Thus, the light emitting device 102 having a vertical type electrode structure in which the first electrode 181 is disposed on the light emitting structure 150 and the support member 173 is disposed under the light emitting structure 150 may be provided.

Figure 7:
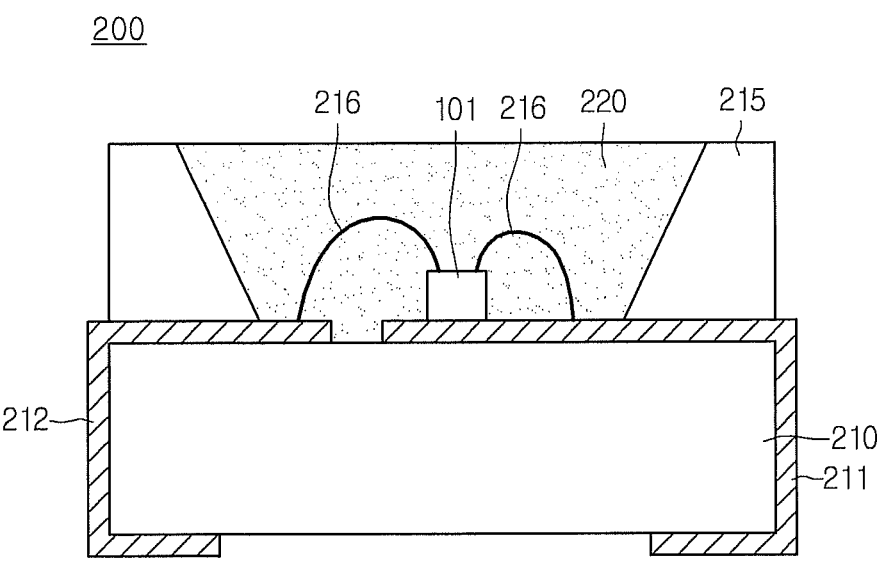
FIG. 7 is a view of a light emitting device package including the light emitting device of FIG. 5.

FIG. 7 is a view of a light emitting device package including the light emitting device of FIG. 5.

Referring to FIG. 7, a light emitting device package 200 includes a body 210, first and second lead electrodes 211 and 212 each having at least one portion disposed on the body 210, a light emitting device 101 electrically connected to first and second lead electrodes 211 and 212 on the body 210, and a molding member 220 surrounding the light emitting device 101 on the body 210.

The body 210 may be formed of a silicon material, a synthetic resin material, or a metal material. The body 210 includes a reflective part 215 having an upwardly opened cavity.

The first lead electrode 211 and the second lead electrode 212 may be electrically separated from each other and pass through the body 210. A portion of each of the first and second lead electrodes 211 and 212 may be disposed on a bottom surface of the cavity of the reflective part 215, and the other portion may protrude to the outside of the body 210.

The first and second lead electrodes 211 and 212 may supply a power into the light emitting device 101. Also, the first and second lead electrodes 211 and 212 may reflect light emitted from the light emitting device 101 to increase light efficiency. In addition, the first and second lead electrodes 211 and 212 may release heat generated in the light emitting device 101 to the outside.

The light emitting device 101 may be disposed on the body 210 or disposed on the first lead electrode 211 and/or the second lead electrode 212.

A wire 216 of the light emitting device 101 may be electrically connected to one of the first and second lead electrodes 211 and 212, but is not limited thereto.

The molding member 220 may surround the light emitting device 101 to protect the light emitting device 101. Also, the molding member 220 may include a phosphor to vary a wavelength of light emitted form the light emitting device 101 using the phosphor.

The light emitting device or the light emitting device package according to an embodiment may be applied to a light unit. The light unit may have a structure in which a plurality of light emitting devices or a plurality of light emitting device packages are arrayed.

The light unit may include illumination lamps, traffic lights, vehicle headlights, and signs.

<Lighting System>

Figure 8:
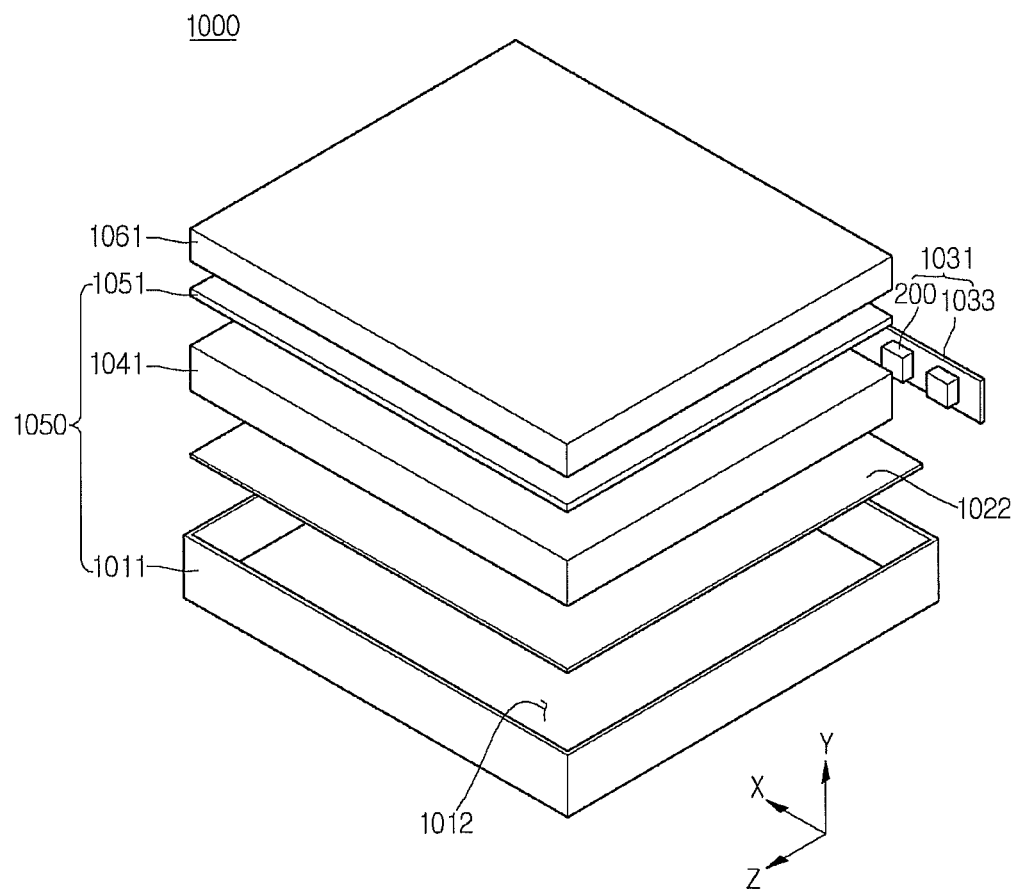
FIG. 8 is a disassembled perspective view of a display apparatus with the light emitting device.
Figure 9:
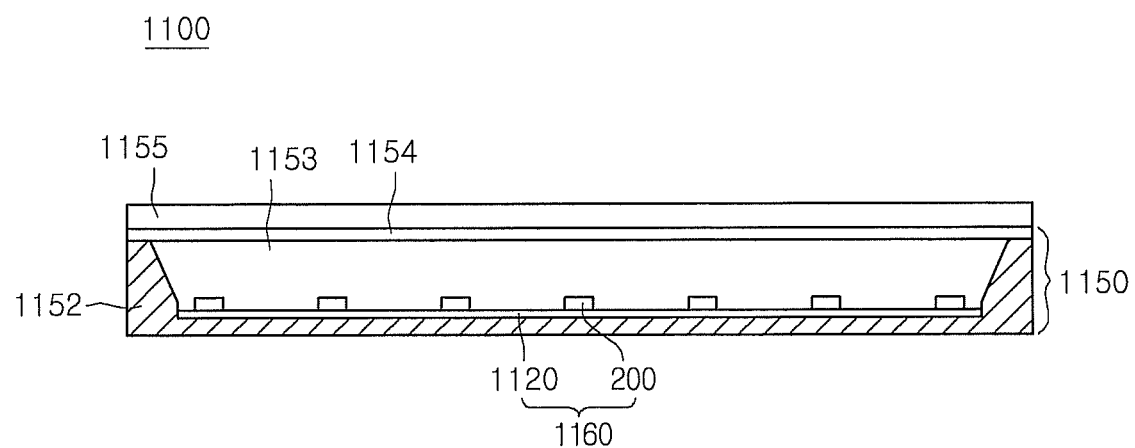
FIG. 9 is a schematic sectional view illustrating another example of a display apparatus with the light emitting device package.
Figure 10:
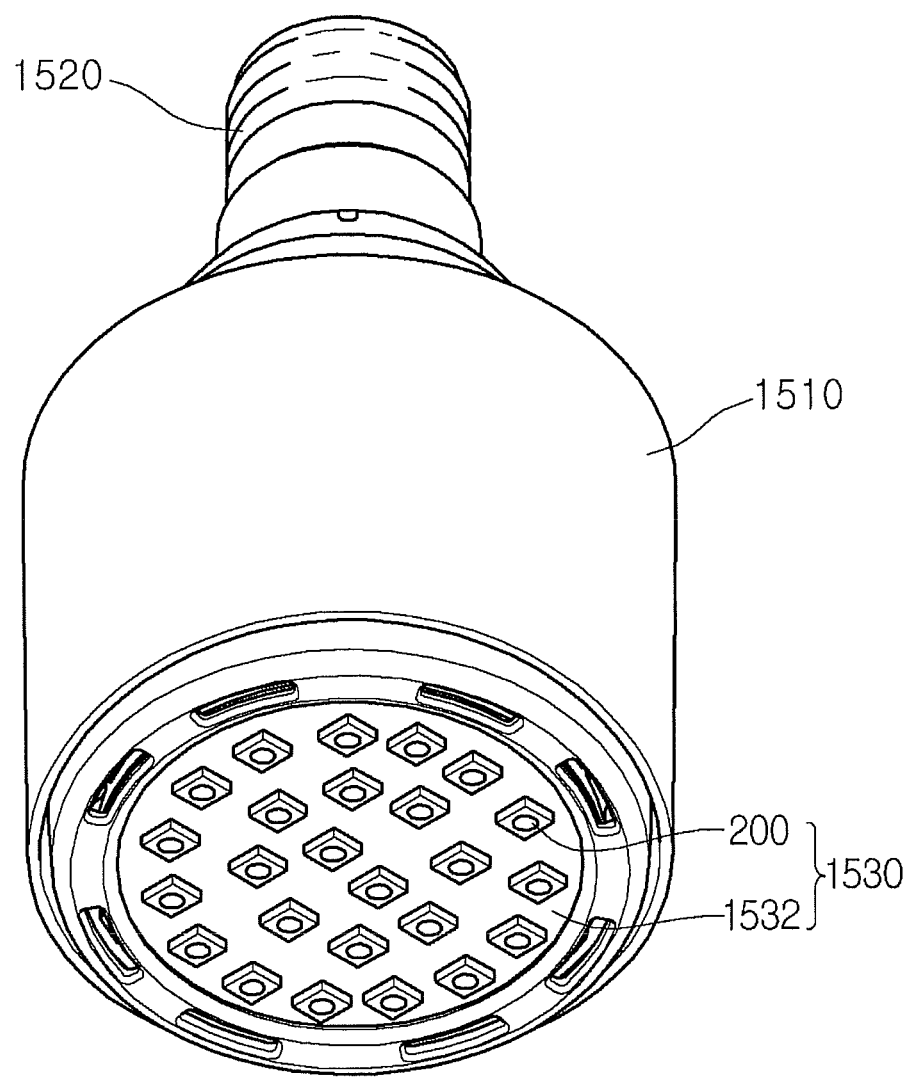
FIG. 10 is a perspective view of a lighting unit with the light emitting device.

The lighting system may include a display apparatus shown in FIGS. 8 and 9, a light unit shown in FIG. 10, in addition to a lighting lamp, a signal light, a vehicle headlight, an electronic display, etc.

FIG. 8 is a disassembled perspective view of a display apparatus according to an embodiment.

Referring to FIG. 8, the display apparatus 1000 according to the embodiment may include a light guide plate 1041, a light emitting module 1031 supplying light to the light guide plate 1041, a reflective member 1022 under the light guide plate 1041, an optical sheet 1051 on the light guide plate 1041, a display panel 1061 on the optical sheet 1051, and a bottom cover 1011 receiving the light guide plate 1041, the light emitting module 1031, and the reflective member 1022, but the present disclosure is not limited thereto.

The bottom cover 1011, the reflective member 1022, the light guide plate 1041, and the optical sheet 1051 may be defined as a light unit 1050.

The light guide plate 1041 functions to transform linear light to planar light by diffusing the linear light. The light guide plate 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide plate 1041, and finally acts as a light source of a display apparatus.

The light emitting module 1031 may include at least one light emitting module in the bottom cover 1011, and provide light directly or indirectly from one side surface of the light guide plate 1041. The light emitting module 1031 may include a board 1033, and a light emitting device package 200 according to embodiments disclosed above, and the light emitting device packages 200 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 200 is mounted on a side surface or a radiant heat plate, the board 1033 may be removed. Herein, some of the radiant heat plate may contact an upper surface of the bottom cover 1011.

The plurality of light emitting device packages 200 may be mounted on the board 1033 such that light emitting surfaces of the plurality of light emitting device packages 200 are spaced apart by a predetermined distance from the light guide plate 1041, but the present disclosure is not limited thereto. The light emitting device package 200 may supply light to a light incident part that is one side surface of the light guide plate 1041, directly or indirectly, but the present disclosure is not limited thereto.

The reflective member 1022 may be provided under the light guide plate 1041. The reflective member 1022 reflects light incident from a lower surface of the light guide plate 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide plate 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide plate 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide plate 1041, and the optical sheet 1051 as optical members positioned on a light path of the light emitting module 1031, but the present disclosure is not limited thereto.

FIG. 9 is a cross-sectional view of a display apparatus according to an embodiment.

Referring to FIG. 9, the display apparatus 1100 includes a bottom cover 1152, a board 1120 on which the light emitting device packages 200 disclosed above are arrayed, an optical member 1154, and a display panel 1155.

The board 1120 and the light emitting device package 200 may be defined as a light emitting module 1160. The bottom cover 1152, the at least one light emitting module 1160, and the optical member 154 may be defined as a light unit 1150.

The bottom cover 1152 may be provided with a receiving part 1153, but the present disclosure is not limited thereto.

Herein, the optical member 1154 may include at least one of a lens, a light guide plate, a diffusion sheet, a horizontal and vertical prism sheet, and a brightness reinforcing sheet. The light guide plate may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1160. The optical member 1154 transforms light emitted from the light emitting module 1160 to planar light, and performs diffusion, light focusing, and the like.

FIG. 10 is a perspective view of a lighting unit according to an embodiment.

Referring to FIG. 10, the lighting unit 1500 may include a case 1510, a light emitting module 1530 including in the case 1510, and a connection terminal 1520 including in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 200 according to the embodiments mounted on the board 1532. The light emitting device package 200 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 200 may be mounted on the board 1532. Each of the light emitting device packages 200 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

The light emitting device according to the embodiment may provide a new active layer. Thus, inner quantum efficiency of the active layer may be improved. Since holes injected into the active layer is dispersed into well layers different from each other, recombination of holes and electrons may be increased to improve intensity of light. Thus, a degree of color purity of light emitted from the active layer may be improved. In the embodiments, the intensity of light may be improved. According to the embodiments, the light emitting device and the light emitting device package including the light emitting device may be improved in reliability.

Features, features, structures and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device having an active layer having a barrier structure of different quantum-barrier structures comprising: a first conductive type semiconductor layer; a second conductive type semiconductor layer on the first conductive type semiconductor layer; the active layer between the first conductive type semiconductor layer and the second conductive type semiconductor layer, the active layer comprising a plurality of well layers and a plurality of barrier layers, wherein the plurality of barrier layers comprise: a first barrier layer that is the nearest to the second conductive type semiconductor layer, the first barrier layer having a first band gap; a second barrier layer adjacent to the first barrier layer, the second barrier layer having a third band gap; and at least one third barrier layer having the first band gap between the second barrier layer and the first conductive type semiconductor layer, the plurality of well layers comprise: a first well layer between the first barrier layer and the second barrier layer, the first well layer having a second band gap; and a second well layer between the second barrier layer and the at least one third barrier layer, wherein the second barrier layer is disposed between the first well layer and the second well layer, and the third band gap is narrower than the first band gape and the third band gap is wider than the second band gap.

2. The light emitting device according to claim 1, wherein the plurality of barrier layers have a same thickness as each other.

3. The light emitting device according to claim 1, wherein the second barrier layer has a thickness thinner than those of the first barrier layer and the at least one third barrier layer.

4. The light emitting device according to claim 3, wherein the second barrier layer has a thickness thicker than that of the first well layer.

5. The light emitting device according to claim 1, comprising a clad layer between the first barrier layer and the second conductive type semiconductor layer, the clad layer having a band gap wider than the first band gap.

6. The light emitting device according to claim 1, wherein the second barrier layer has a barrier height greater than about 50% of that of the first barrier layer.

7. The light emitting device according to claim 1, wherein the second band gap is more than about 2.75 eV and less than about 3.42 eV.

8. The light emitting device according to claim 1, wherein the second barrier layer has a compositional formula of $In_xGa_{1-x}N$ ($0.03<x<0.05$).

9. The light emitting device according to claim 1, wherein the second barrier layer has an indium content greater than that of the first barrier layer.

10. A light emitting device having an active layer having a barrier structure of different quantum-barrier structures comprising: a first conductive type semiconductor layer; a second conductive type semiconductor layer; and the active layer between the first conductive type semiconductor layer and the second conductive type semiconductor layer, the active layer comprising a plurality of well layers and a plurality of barrier layers, wherein the plurality of barrier layers comprise: a first barrier layer that is the nearest to the second conductive type semiconductor layer, the first barrier layer having a first band gap; a second barrier layer adjacent to the first barrier layer the second barrier layer having a third band gap; and at least one third barrier layer having the first band gap between the second barrier layer and the first conductive type semiconductor layer, the plurality of well layers comprise: a first well layer between the first barrier layer and the second barrier layer; and a second well layer between the second barrier layer and the at least one third barrier layer, the plurality of well layers have a same thickness and a same second band gap as each other, the second barrier layer is disposed between the first well layer and the second well layer, and the third band gap is narrower than the first band gap, and the third band gap is wider than the second band gap.

11. The light emitting device according to claim 10, wherein the second barrier layer has a thickness thicker than those of the first barrier layer and the at least one third barrier layer.

12. The light emitting device according to claim 10, wherein the second barrier layer has a thickness thicker than that of the first well layer.

13. The light emitting device according to claim 10, wherein the second barrier layer has an aluminum content less than that of the first barrier layer.

14. The light emitting device according to claim 10, wherein a difference between the first band gap and the third band gap is more than about 0.01 eV.

15. The light emitting device according to claim 11, wherein a thickness difference between the second barrier layer and the at least one third barrier layer ranges from about 1 nm to about 3 nm.

16. The light emitting device according to claim 12, wherein the second barrier layer has a thickness thicker by about 0.1 nm to about 1 nm than a thickness of the first well layer.

17. The light emitting device according to claim 12, wherein the second barrier layer has a thickness of about 3 nm to about 4 nm.

18. The light emitting device according to claim 10, wherein the second barrier layer comprises a semiconductor layer different from the first barrier layer.

19. The light emitting device according to claim 10, wherein the first conductive type semiconductor layer comprises an n-type dopant,
the second conductive type semiconductor layer comprises a p-type dopant,
each of the plurality of well layers comprises an InGaN-based semiconductor, and
the first barrier layer comprises a semiconductor having a compositional formula of $In_xAl_yGa_{1-x-y}N$ ($0 \leq x \leq 1$, $0 \leq y \leq 1$, $0 \leq x+y \leq 1$).

20. A light emitting device having an active layer having a barrier structure of different quantum-barrier structures comprising: a first conductive type semiconductor layer comprising a nitride semiconductor layer; a second conductive type semiconductor layer comprising a nitride semiconductor layer; and the active layer between the first conductive type semiconductor layer and the second conductive type semiconductor layer, the active layer comprising a plurality of barrier layers and a plurality of well layers that are alternately disposed, wherein the plurality of well layers comprise: a first well layer that is the nearest to the second conductive type semiconductor layer; and a second well layer that is the nearest to the first well layer, wherein each of the first and second well layers has a second band gap, the plurality of barrier layers comprise: a plurality of first barrier layers, each having a first band gap; and one second barrier layer having a third band gap, the second barrier layer is disposed between the first well layer and the second well layer, and the third band gap is less than the first band gap and is greater than the second band gap.

* * * * *